(12) United States Patent
Shkolnikov et al.

(10) Patent No.: US 8,134,066 B2
(45) Date of Patent: Mar. 13, 2012

(54) ELECTRIC POWER GENERATOR

(75) Inventors: Yury Shkolnikov, Glenview, IL (US); Zinovy Royzen, Seattle, WA (US); Anatoly Gosis, Palatine, IL (US); Steven E. Broerman, Cincinnati, OH (US)

(73) Assignee: Illinois Tool Works Inc., Glenview, IL (US)

( * ) Notice: Subject to any disclaimer, the term of this patent is extended or adjusted under 35 U.S.C. 154(b) by 814 days.

(21) Appl. No.: 11/500,156

(22) Filed: Aug. 7, 2006

(65) Prior Publication Data
US 2008/0029624 A1    Feb. 7, 2008

(51) Int. Cl.
*H01L 35/30* (2006.01)
*H01L 35/28* (2006.01)
*B05B 5/00* (2006.01)
*F23D 11/32* (2006.01)

(52) U.S. Cl. ........ 136/205; 136/208; 136/209; 136/210; 136/218; 239/690

(58) Field of Classification Search .......... 136/208–210, 136/218, 205; 239/690
See application file for complete search history.

(56) References Cited

U.S. PATENT DOCUMENTS

| | | | |
|---|---|---|---|
| 3,608,823 A | 9/1971 | Buschor | |
| 3,651,354 A | 3/1972 | Cowan | |
| 3,666,976 A | 5/1972 | Gourlay et al. | |
| 3,673,463 A | 6/1972 | Gourdine | |
| 3,687,368 A | 8/1972 | Geberth, Jr. | |
| 3,691,408 A * | 9/1972 | Rosso | 310/306 |
| 3,731,145 A * | 5/1973 | Senay | 361/227 |
| 3,791,579 A | 2/1974 | Cowan | |
| 3,991,710 A | 11/1976 | Gourdine et al. | |
| 4,020,393 A | 4/1977 | Porter | |
| 4,165,022 A | 8/1979 | Bentley et al. | |
| 4,219,865 A | 8/1980 | Malcolm | |
| 4,248,386 A | 2/1981 | Morle | |
| 4,290,091 A | 9/1981 | Malcolm | |

(Continued)

FOREIGN PATENT DOCUMENTS

JP    59216480    12/1984

(Continued)

OTHER PUBLICATIONS

Search Report dated Dec. 14, 2007. http://www.hi-z.com/index.html. http://www.amasci.com/wirbel.txt.

*Primary Examiner* — Basia Ridley
*Assistant Examiner* — Lindsey Bernier
(74) *Attorney, Agent, or Firm* — Barnes & Thornburg LLP

(57) ABSTRACT

In one embodiment, a vortex tube has a gas inlet port, a cold gas outlet port and a hot gas outlet port. A thermoelectric potential generator having hot gas inlet port coupled to the hot gas outlet port of the vortex tube, a cold gas inlet port coupled to the cold gas outlet port of the vortex tube, and a thermoelectric element coupled in heat conducting relationship between the cold gas inlet port and the hot gas inlet port to promote the flow of heat/cold through the thermoelectric element from the hot gas flowing into the hot gas inlet port to the cold gas flowing through the cold gas inlet port. In another, a compressed gas source, a thermoelectric element having first and second sides, and an expansion nozzle are coupled in series. The expansion nozzle is coupled between the compressed gas source and the first side. The thermoelectric element includes an electrical output port.

4 Claims, 5 Drawing Sheets

U.S. PATENT DOCUMENTS

| | | |
|---|---|---|
| 4,331,298 A | 5/1982 | Bentley et al. |
| 4,433,003 A | 2/1984 | Gourdine |
| 4,498,631 A | 2/1985 | Gourdine |
| 4,574,092 A | 3/1986 | Gourdine |
| 6,471,778 B1 * | 10/2002 | Baltz et al. .................... 118/620 |

FOREIGN PATENT DOCUMENTS

| | | |
|---|---|---|
| RU | 2081337 C1 | 10/1997 |
| RU | 2233352 C1 | 7/2004 |

* cited by examiner

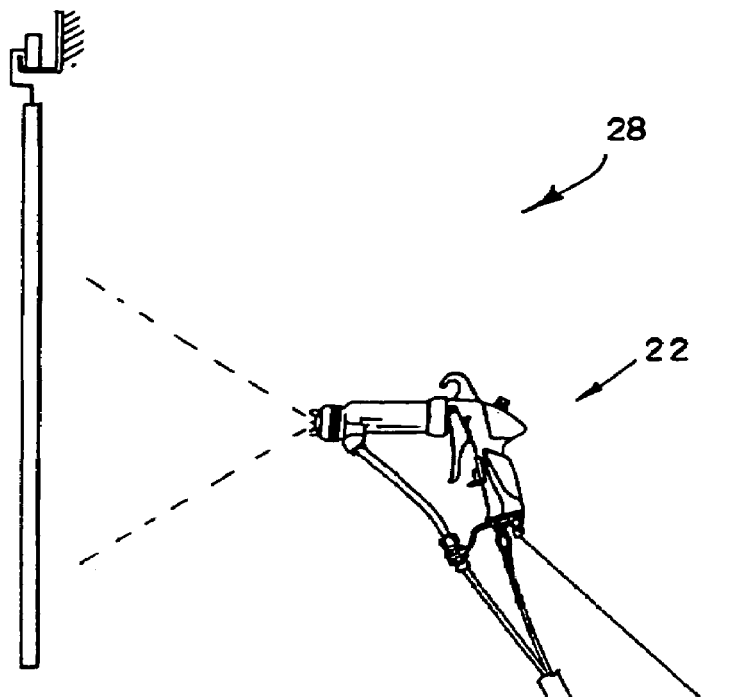
FIG. 1
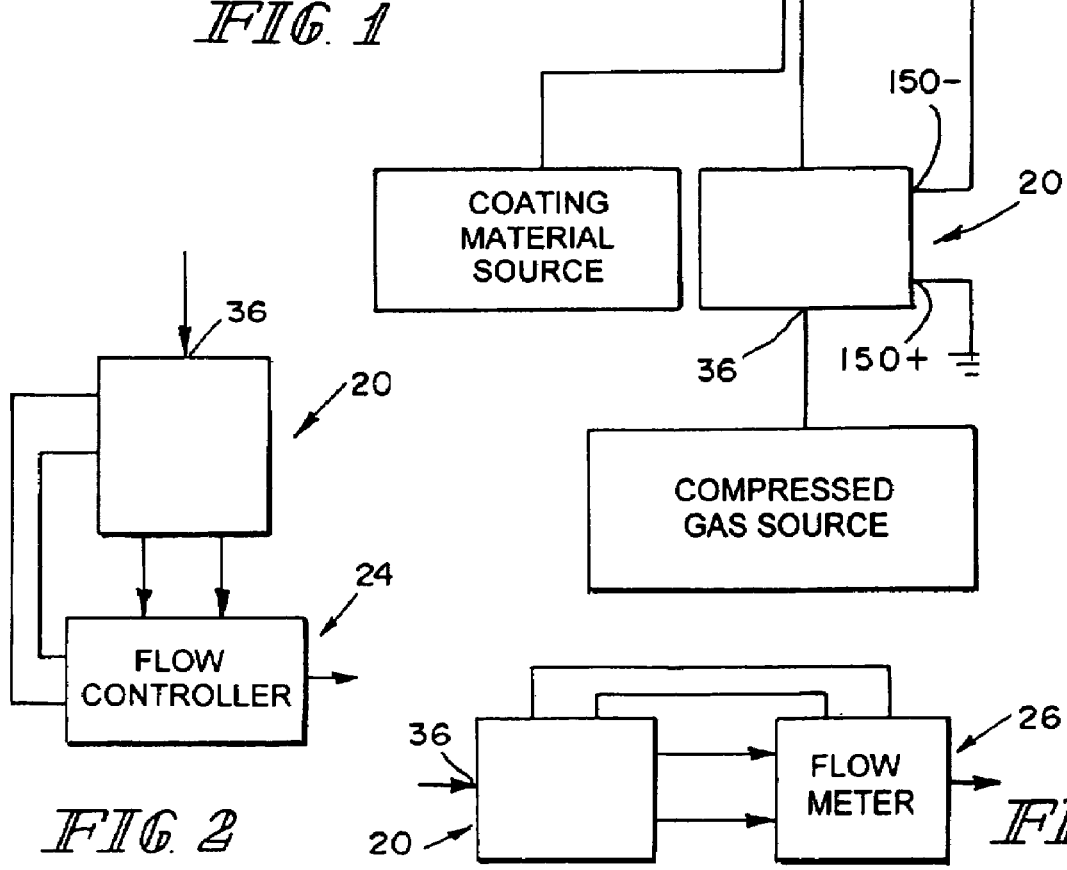
FIG. 2
FIG. 3

ELECTRIC POWER GENERATOR

FIELD OF THE INVENTION

This invention relates to generators which generate electrical potentials.

BACKGROUND OF THE INVENTION

Various types of generators which generate electrical potentials from flowing fluids are known. There are, for example, the systems illustrated and described in U.S. Pat. Nos. 4,248,386 and 3,666,976 and references cited in these. Various types of generators which employ fluid flow to generate electrical potentials are also known. There are, for example, the devices illustrated and described in U.S. Pat. Nos. 4,574,092, 4,498,631, 4,433,003, 4,020,393, 3,991,710, 3,791,579, 3,673,463, and 3,651,354 (generally electrogasdynamic potential supplies); and U.S. Pat. Nos. 4,290,091 and 4,219,865 (generally compressed gas turbine driven generator/inverter/transformer/multiplier supplies and alternator/transformer/multiplier supplies). There are also the devices illustrated and described at http://www.hi-z.com/index.html and http://www.amasci.com/wirbel.txt. As used herein, the word gas includes mixtures of gases, such as air. The disclosures of these references are hereby incorporated herein by reference. This listing is not intended to be a representation that a complete search of all relevant art has been made, or that no more pertinent art than that listed exists, or that the listed art is material to patentability. Nor should any such representation be inferred.

DISCLOSURE OF THE INVENTION

According to an aspect of the invention, a source of a relatively colder gas flow and a source of a relatively hotter gas flow are coupled to a thermoelectric potential generator having hot gas inlet port coupled to the hot gas source, a cold gas inlet port coupled to the cold gas source, and a thermoelectric element coupled in heat conducting relationship between the cold gas inlet port and the hot gas inlet port.

Illustratively according to this aspect of the invention, the source of the relatively colder gas flow and the source of the relatively hotter gas flow together comprise a vortex tube having a gas inlet port, a cold gas outlet port comprising the source of the relatively colder gas flow and a hot gas outlet port comprising the source of the relatively hotter gas flow.

According to another aspect of the invention, a source of compressed gas, an expansion nozzle and a thermoelectric element having first and second sides are coupled in series. The expansion nozzle is coupled between the compressed gas source and the first side. The thermoelectric element includes an electrical output port.

Illustratively, the thermoelectric element comprises a Seebeck effect element.

Illustratively, an output potential is established across the output port by the flow of heat through the thermoelectric element. The combination further comprises a utilization device coupled to the electrical output port for utilizing the output potential.

Alternatively illustratively, an output current is established through the output port by the flow of heat through the thermoelectric element. The combination further comprising a utilization device coupled to the electrical output port for utilizing the output current.

Illustratively, the utilization device comprises an electrostatically aided coating material atomizer.

Illustratively, the utilization device comprises a flow controller.

Illustratively, the utilization device comprises a flow meter.

Illustratively, the utilization device comprises an environment in which the presence of electrical conductors is undesirable.

Illustratively, the utilization device comprises an inverter.

Illustratively, the utilization device comprises a transformer.

Illustratively, the utilization device comprises a rectifier.

Illustratively, the utilization device comprises a potential multiplier.

BRIEF DESCRIPTION OF THE DRAWINGS

The invention may best be understood by referring to the following detailed description and accompanying drawings which illustrate the invention. In the drawings:

FIG. 2 illustrates a diagrammatic elevational view of a system incorporating apparatus according to the invention;

FIG. 3 illustrates a diagrammatic elevational view of a system incorporating apparatus according to the invention;

FIG. 7 illustrates a sectional elevational view of the detail illustrated in FIG. 6, taken generally along section lines 7-7 thereof;

DETAILED DESCRIPTIONS OF ILLUSTRATIVE EMBODIMENTS

Figure 4:
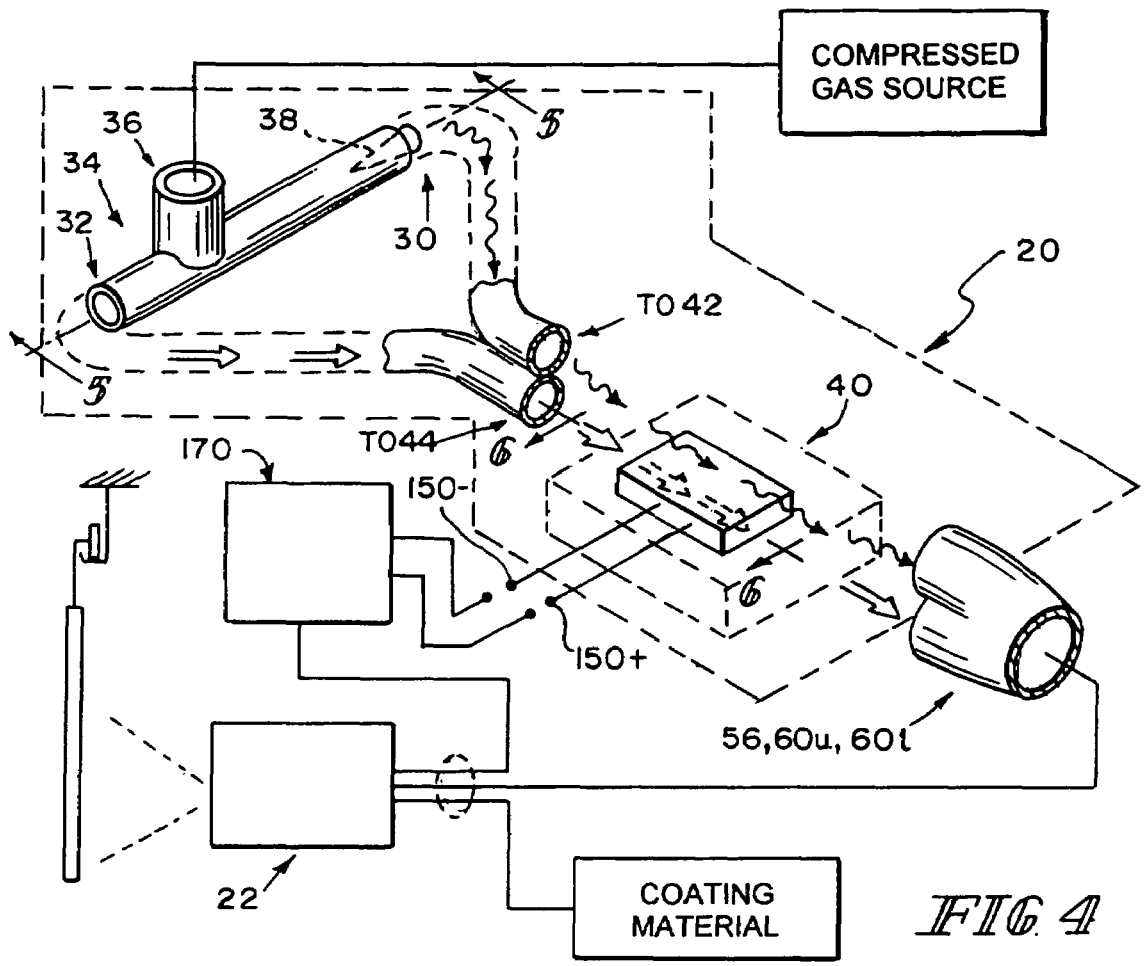
FIG. 4 illustrates a diagrammatic partly perspective view of a system incorporating apparatus according to the invention.
Figure 5:
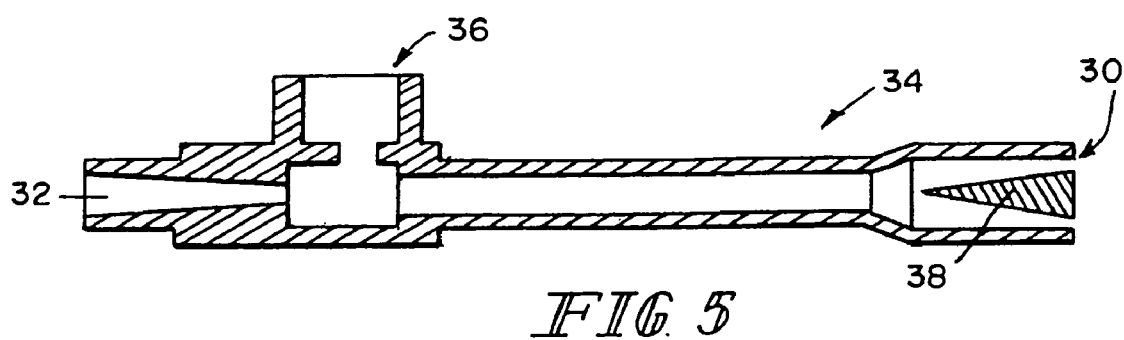
FIG. 5 illustrates a sectional elevational view of a detail of the system illustrated in FIG. 4, taken generally along section lines 5-5 thereof.
Figure 1:
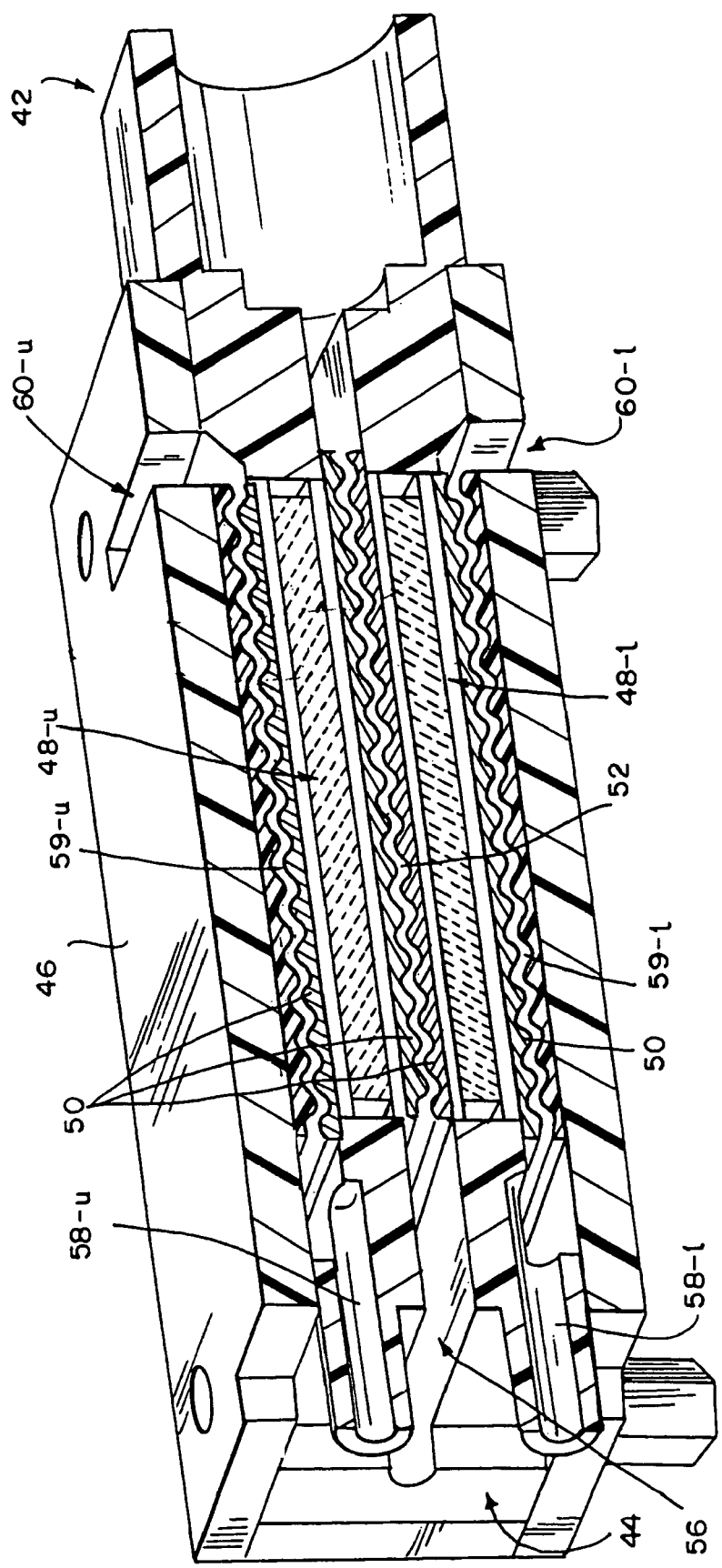
FIG. 1 illustrates a partly diagrammatic elevational view of a system incorporating apparatus according to the invention.

Referring first to FIGS. 1-3, a thermoelectric potential generator 20 having few or no moving parts produces electrical power in an application where compressed gas is available and electrical power is needed. For, for example, FIGS. 1 and 4 illustrate an electrostatically aided coating material atomizer 22, FIGS. 2-3, a self-powered flow controller 24, flow meter 26 or the like, and FIG. 1 illustrates a production environments 28 where compressed gas (for example, air) is available and the presence of lengths of electrical cable and/or electrically powered electrical supplies is undesirable. Referring to FIGS. 4-5, the thermoelectric potential generator 20 may be powered from the hot and cold output ports 30, 32, respectively, of a Ranque-Hilsch vortex tube 34. See, for example, the above referenced http://www.amasci.com/wirbel.txt. In certain embodiments, the thermoelectric generator 20 comprises a Seebeck (reverse Peltier) effect device. See, for example, the above referenced http://www.hi-z.com/index.html.

Vortex tube 34 separates an inlet compressed gas stream at an inlet port 36 thereof into two gas streams, one of which is directed toward a hot gas outlet port 30 and the other of which is directed toward a cold gas outlet port 32. The hot gas outlet port 30 is equipped with a ring slot valve 38, such as a needle valve, which illustratively is adjustable axially inwardly into port 30 and axially outwardly from port 30 to control flow and temperature differential of the gases flowing from ports 30, 32.

Figure 6:
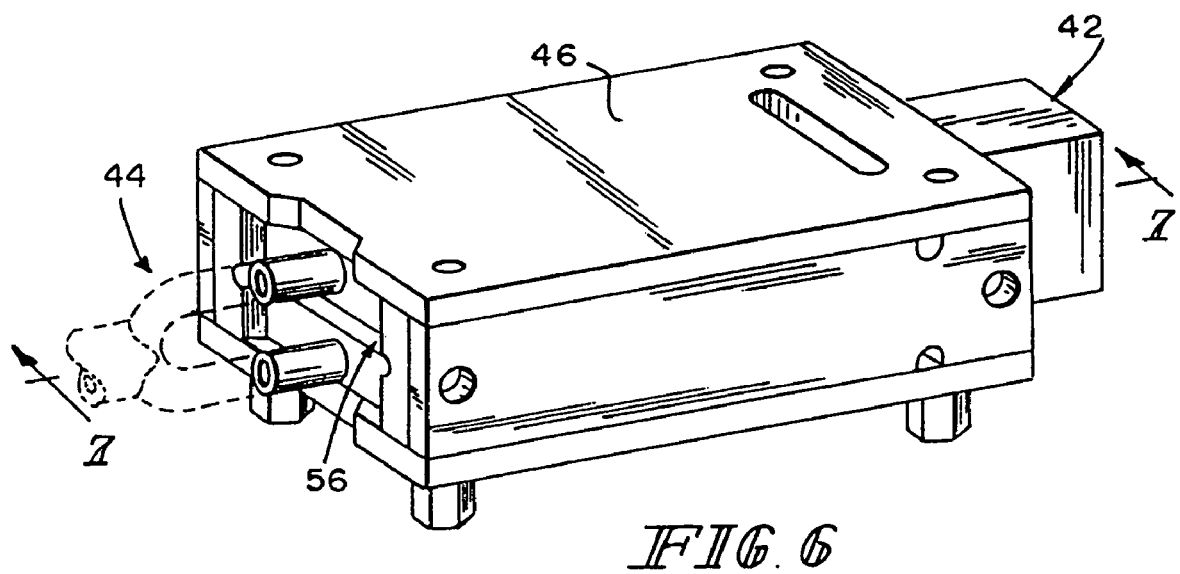
FIG. 6 illustrates a perspective view of a detail of the system illustrated in FIG. 4.

Referring to FIGS. 6-7, the illustrated thermoelectric generator 20 further includes one or more thermoelectric modules 48. The thermoelectric generator 20 includes a hot gas inlet port 42, a cold gas manifold 44, a housing 46, thermoelectric modules 48, and heat sinks 50. The hot gas outlet port 30 of the vortex tube 34 is coupled to hot gas inlet port 42 and the cold gas outlet port 32 of vortex tube 34 is coupled to cold gas manifold 44.

Hot gas from port 30 enters hot gas inlet port 42 and flows through a serpentine (to increase active heat transfer surface area) heat transfer channel 52. Heat is transferred from the hot gas supplied from inlet port 42 to the lower thermoelectric module 48-1 and the upper thermoelectric module 48-$u$. The air is then exhausted through an exhaust outlet port 56.

Cold gas manifold 44 provides streams of cold gas to inlet ports 58-$u$ and 58-$l$. The streams flow through serpentine heat transfer channels 59-$u$ and 59-$l$, respectively. The stream flowing through channel 59-$u$ removes heat from the side of the upper thermoelectric module 48-$u$ opposite channel 52 and the stream flowing through channels 59-$l$ removes heat from the side of the lower thermoelectric module 48-$l$ opposite channel 52. After passing through housing 46, the gas is exhausted through exhaust ports 60-$u$ and 60-$l$. Multiple modules such as modules 48-$u$, -$l$ may be coupled in parallel or series to provide the desired electrical potential and/or current for the load to be coupled across the output terminals of the thermoelectric generator 20.

Ring slot valve 38 can be used to equalize the flow rates through ports 56 and 60-$u$, -$l$ of thermoelectric generator 20 and/or to promote and/or to stabilize flow from adjacent the interior wall of the vortex tube 34.

Heat sinks 50 are constructed from suitably thermally conductive materials, such as copper. Housing 46 and the sides of channels 59-$u$, 59-$l$ adjacent to housing 46 may be constructed from thermally and/or electrically insulating materials. The vortex tube 34 may also be made out of heat insulating material, such as certain heat- and/or cold-resistant, filled and/or unfilled resins and polymers in order to reduce heat losses/gains upstream from inlet ports 42, 58-$u$, -$l$.

Figure 8:
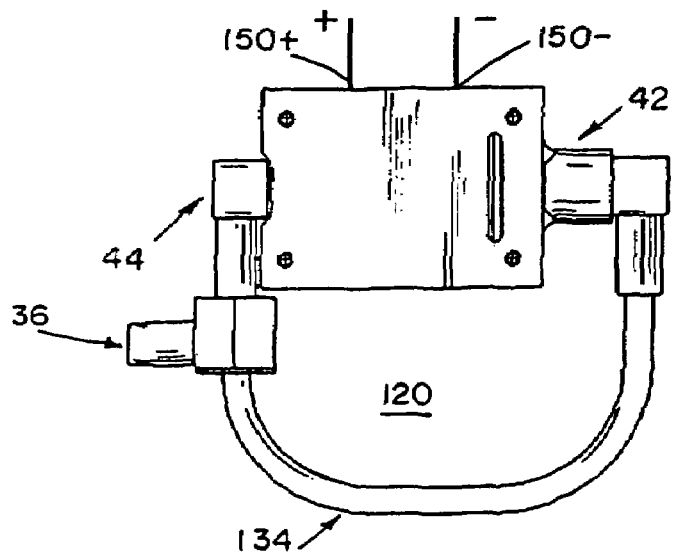
FIG. 8 illustrates a plan view of certain details of another embodiment of the invention.
Figure 9A:
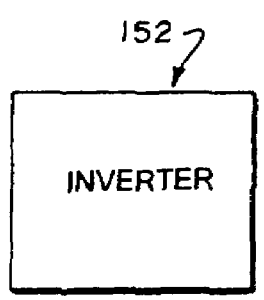
FIGS. 9a-d illustrate diagramatically details of the system illustrated in FIG. 4; and, FIG. 10 illustrates a highly diagrammatic view of another system incorporating apparatus according to the invention.
Figure 9B:
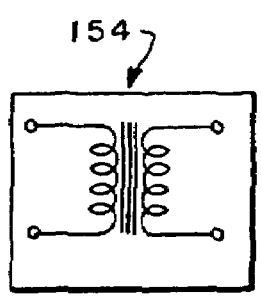
Figure 9C:
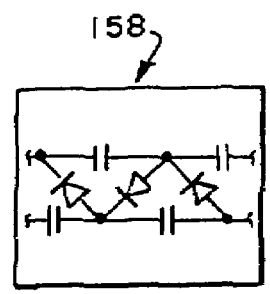
Figure 9D:
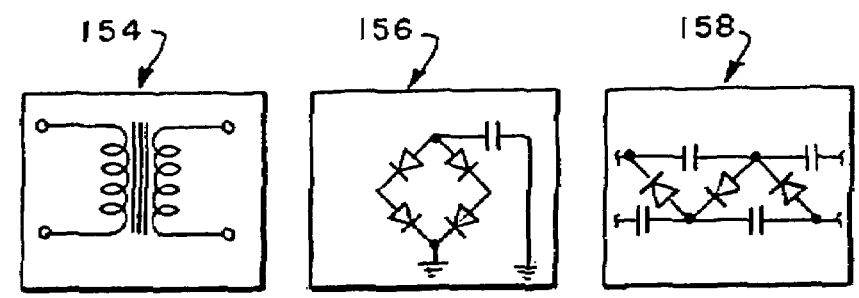

In an embodiment of the vortex tube illustrated in FIG. 8, the vortex tube 134 is somewhat U-shaped in an effort to make the thermoelectric generator 120 somewhat more compact.

Referring again to FIG. 4, the electrical output terminals 150+ and 150− of thermoelectric generator 20 or 120 may be coupled to input terminals of suitable power conditioning equipment 170 such as, for example, (an) inverter(s) 152 (FIG. 9$a$) and/or transformer(s) 154 (FIG. 9$b$) and/or rectifier(s) 156 (FIG. 9$c$) and/or multiplier(s) 158 (FIG. 9$d$), and the like, which condition the output electrical signal from thermoelectric generator 20 or 120 for use in a utilization device such as electrostatically aided coating material atomizer 22, self-powered gas flow controller 24, flow meter 26 or the like. Such power conditioning equipment 170 may, for example, be equipment of the type illustrated and described in any of the above listed references or in U.S. Pat. Nos. 4,331, 298, 4,165,022, 3,731,145, 3,687,368, and 3,608,823. The disclosures of these references are hereby incorporated herein by reference. This listing is not intended to be a representation that a complete search of all relevant art has been made, or that no more pertinent art than that listed exists, or that the listed art is material to patentability. Nor should any such representation be inferred.

Figure 10:
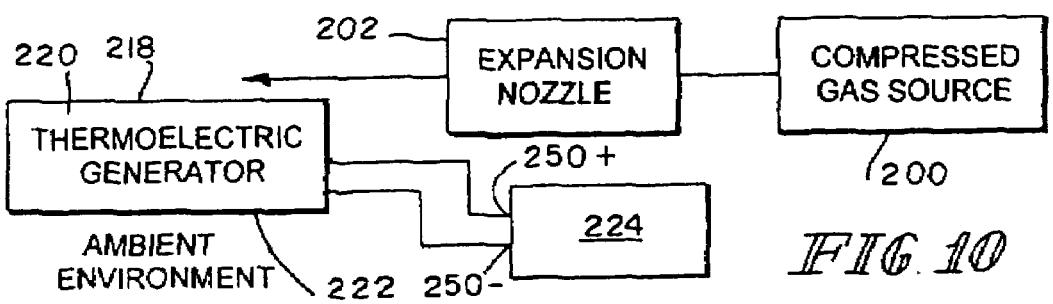

In another embodiment illustrated in FIG. 10, the expansion of compressed gas from a source 200 generates a cold stream which is used to generate electric power while it flows along thermoelectric units. This embodiment is useful in, for example, aerospace and like applications in which compressed gases flow through expansion nozzles. As the compressed gas flows through the expansion nozzle 202, the gas expands and cools. The expanded and cooled stream of gas flows across one side 218 of a thermoelectric generator 220, the other side 222 of which is exposed to, for example, room temperature air or the like. The temperature differential across the thermoelectric generator 220 causes current to flow in a circuit 224 coupled across the terminals 250+, 250− of the electrical output port of the thermoelectric generator 220.

What is claimed is:

1. A system comprising a vortex tube having a gas inlet port, a first cold gas outlet port and a first hot gas outlet port, a thermoelectric potential generator having a hot gas inlet port coupled to the first hot gas outlet port of the vortex tube, a cold gas inlet port coupled to the first cold gas outlet port of the vortex tube, and at least one of a second hot gas outlet port, a second cold gas outlet port and a mixed gas outlet port for exhausting at least one of hot gas, cold gas and mixed gas from the thermoelectric potential generator, (a) thermoelectric element(s) coupled in heat conducting relationship between the cold gas inlet port and the hot gas inlet port, the thermoelectric element further comprising an electrical output port through which an output current is established by the heat/cold flow through the thermoelectric element, and an electrostatically-aided coating material atomizer coupled to the electrical output port for utilizing the output current and to the at least one of the second hot gas outlet port, the second cold gas outlet port and the mixed gas outlet port for utilizing the gas exhausted therefrom as a pneumatic atomization gas supply to the electrostatically-aided coating material atomizer.

2. The system of claim 1 further comprising a high-magnitude electrostatic potential multiplier for coupling the electrostatically-aided coating material atomizer to the electrical output port.

3. A coating material dispensing system comprising an electrostatically-aided coating material atomizer, a vortex tube and a thermoelectric potential generator, the electrostatically-aided coating material atomizer including a first coating material atomizer input port for a voltage supply, a second coating material atomizer input port for compressed gas and a third coating material atomizer input port for coating material to be dispensed by the electrostatically-aided coating material atomizer, the vortex tube including a vortex tube input port for compressed gas, a first vortex tube output port for hot compressed gas, and a second vortex tube output port for cold compressed gas, the thermoelectric potential generator including a first thermoelectric potential generator input port for hot compressed gas, a second thermoelectric potential generator input port for cold compressed gas, a first thermoelectric potential generator output port for supplying voltage, and a second thermoelectric potential generator output port for supplying at least one of hot compressed gas, cold compressed gas and mixed compressed gas, the vortex tube input port being coupled to a source of compressed gas, the first vortex tube output port being coupled to the first thermoelectric potential generator input port, the second vortex tube output port being coupled to the second thermoelectric potential generator input port, the first thermoelectric potential generator output port being coupled to the first coating material atomizer input port and the second thermoelectric potential generator output port being coupled to the second coating material atomizer input port.

4. The system of claim 3 wherein the electrostatically-aided coating material atomizer further comprises a high-magnitude electrostatic potential multiplier coupled to the first coating material atomizer input port to multiply the voltage supplied to the first coating material atomizer input port.

* * * * *